(12) United States Patent
Ahrens et al.

(10) Patent No.: US 6,873,242 B2
(45) Date of Patent: Mar. 29, 2005

(54) MAGNETIC COMPONENT

(75) Inventors: Carsten Ahrens, Munich (DE); Ulf Bartl, Munich (DE); Wolfgang Hartung, Munich (DE); Reinhard Losehand, Munich (DE); Hubert Werthmann, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/797,221

(22) Filed: Mar. 10, 2004

(65) Prior Publication Data

US 2004/0191569 A1 Sep. 30, 2004

Related U.S. Application Data

(63) Continuation of application No. PCT/EP02/08295, filed on Jul. 25, 2002.

(30) Foreign Application Priority Data

Sep. 10, 2001 (DE) .......................................... 101 44 380

(51) Int. Cl.⁷ .............................................. H01F 5/00
(52) U.S. Cl. ....................... 336/200; 336/232; 336/223; 336/174
(58) Field of Search ................................ 336/200, 223, 336/232, 174

(56) References Cited

U.S. PATENT DOCUMENTS

| | | | |
|---|---|---|---|
| 5,279,988 A | 1/1994 | Saadat et al. ................ | 437/195 |
| 5,609,946 A | * 3/1997 | Korman et al. ............. | 428/209 |
| 5,847,634 A | * 12/1998 | Korenivski et al. ......... | 336/200 |
| 5,998,048 A | 12/1999 | Jin et al. ..................... | 428/694 |
| 6,008,102 A | 12/1999 | Alford et al. ............... | 438/381 |
| 6,103,405 A | 8/2000 | Tomita ........................ | 428/692 |
| 6,788,183 B2 * | 9/2004 | Von Der Weth et al. ... | 336/200 |

FOREIGN PATENT DOCUMENTS

| | | | |
|---|---|---|---|
| DE | 101 04 648 A1 | 1/2002 | .......... H01F/17/04 |
| EP | 0 684 616 A1 | 5/1995 | .......... H01F/17/00 |
| EP | 0 725 407 A1 | 1/1996 | .......... H01F/17/00 |
| JP | 57111006 | 7/1982 | .......... H01F/15/00 |

OTHER PUBLICATIONS

J.A. Power et al., "An investigation of On Chip Spiral Induktor on .06 μm BiCMOS technology for Application"; IEEE Int. Conf. on Microelectronic Test Structures, vol. 12, pp. 18–23, 1999.
A. Gromov et al., "A Model for Impedance of Planar RF Inductors Based on Magnetic Films"; IEEE Transactions on Magnetics, vol. 34, No. 4, pp. 1246–1248, Jul. 1998.
M. Yamaguchi et al., "Characteristics and Analysis of a Thin Film Inductor with Closed Magnetic Circuit Structure"; IEEE Transactions on Magnetics, vol. 28, No. 5, pp. 3015–3017, Sep. 1992.
T. Inoue et al., "The Effect of Magnetic Film Structure on the Inductance of a Planar Inductor"; IEEE Transactions on Magnetics, vol. 34, No. 4, pp. 1372–1374, Jul. 1998.
Park, J.Y., et al.; Batch–Fabricated Microinductors with Electroplated Magnetically Anisotropic and Laminated Alloy Cores; IEEE Transactions on Magnetics, vol. 35, No. 5, pp. 4291–4300, 1999.
Nose, M., et al.; "Domain Structures and High–Frequency Response of Magnetization for CoNBZR Stripe Films"; IEEE Translation Journal on Magnetics; pp. 59–66, 1994.

\* cited by examiner

*Primary Examiner*—Anh Mai
(74) *Attorney, Agent, or Firm*—Baker Botts L.L.P.

(57) ABSTRACT

The magnetic component uses at least two different layers of magnetic material for carrying and amplifying the magnetic flux. The use of two different layers which may, however, have the same material composition allows the magnetic conductors to form a magnetic circuit with a locally matched domain alignment. The magnetic component accordingly allows considerable improvements to be achieved in the component parameter, in particular a considerable increase in the Q-factor.

12 Claims, 3 Drawing Sheets

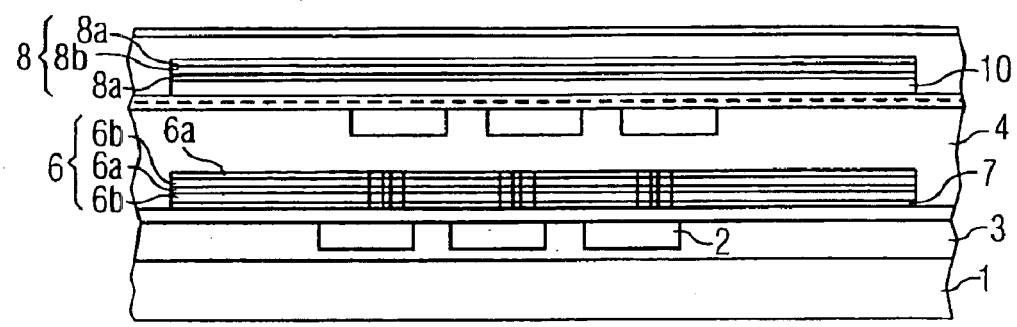
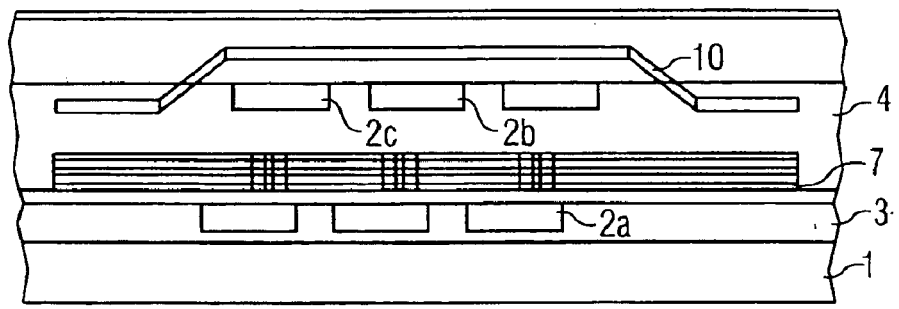

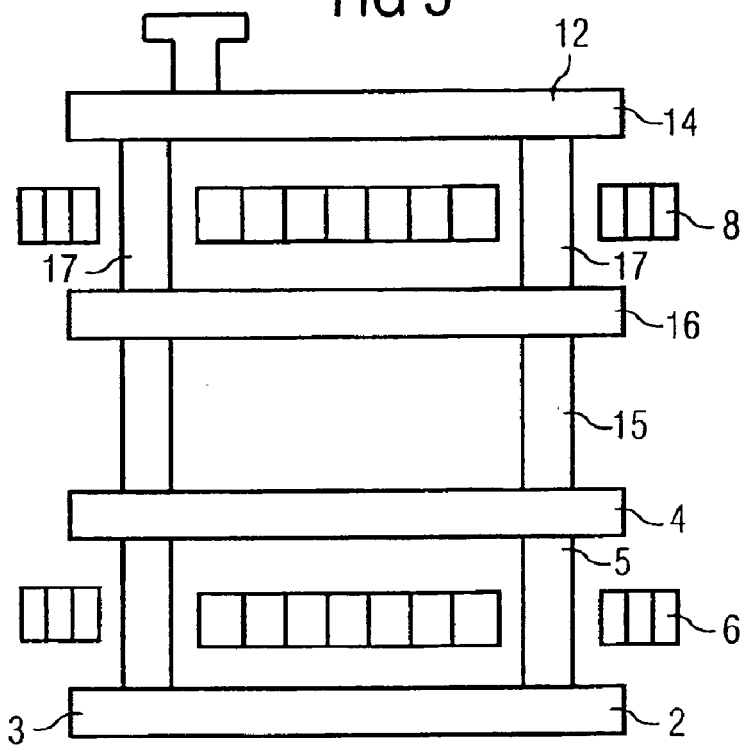
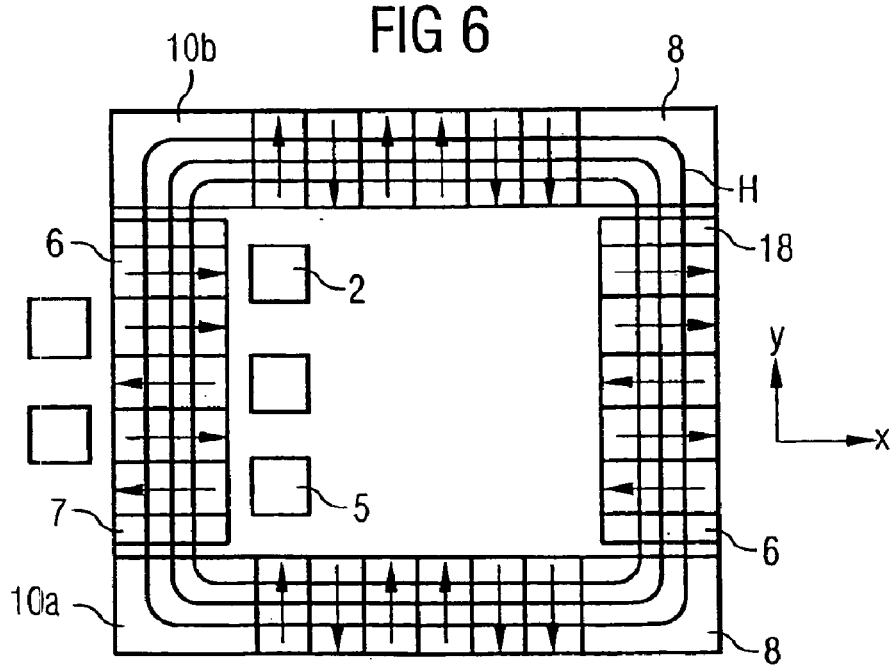

MAGNETIC COMPONENT

CROSS REFERENCE TO RELATED APPLICATION

This application is a continuation of copending International Application No. PCT/EP02/08295 filed Jul. 25, 2002 which designates the United States, and claims priority to German application no. 101 44 380.3 filed Sep. 10, 2001.

TECHNICAL FIELD OF THE INVENTION

The present invention relates to a magnetic component. The present invention relates in particular to a magnetic component which is integrated with other components on a substrate, for example an integrated inductance or an integrated transformer.

BACKGROUND OF THE INVENTION

Passive magnetic components, such as coils or transformers, are required for a large number of applications. For example, at the moment, up to 300 passive components are processed in a mobile radio telephone, with major functions being carried out by magnetic components. Every extension in function, irrespective of whether this is a dual band or dual mode extension, increases the number further. The mounting, the soldering and the testing of the individual components, which are becoming ever smaller, in this case are the cause of a major proportion of the costs for the equipment manufacturers. In this case, coils and inductors have frequently been produced until now using a thick film technique on ceramic substrates or as air-cored windings. Although these coils have high Q-factors, they are relatively expensive. In this case, the Q-factor Q of a coil is calculated from the ratio of its inductance L to its resistance R. In this case, $Q = \omega L/R$ where $\omega = 2\pi f$ and the value of Q is normally determined at a frequency f=1 GHz.

In order to reduce the production costs, the aim of many developments is to integrate a large number of passive components, such as filters, passive networks, RF inductors, and, in particular, magnetic components on one chip. Integrated inductors are at the moment virtually exclusively in the form of planar spiral coils, which are normally arranged on the uppermost metalization plane. As a rule, the coils are composed of metal (for example Al, AlSiCu, Cu) so that they have a relatively low electrical resistance. In consequence, it is possible to produce integrated inductors which achieve a Q-factor of up to about 15 at a frequency of 1 GHz. Spiral coils such as these are described, for example, in the documents J. A. Power et al., "An Investigation of On Chip Spiral Inductor on 0.6 $\mu$m BiCMOS Technology for Application", 1999 IEEE Int. Conf. on Microelectronic Test Structures, Vol. 12, Ireland 1999 pages 18–23 and A. Gromov et al., "A Model of Impedance of Planar RF Inductors Based on Magnetic Films," IEEE Transactions On Magnetics, Vol. 34, No. 4, Jul. 1998, pages 1246–48.

Unfortunately, spiral coils such as these also have a large number of disadvantages which have until now prevented higher Q-factors from being achieved. A spiral coil is based on conductor rings which, as the number of turns increases, carry the conductor in the interior of the surface which is surrounded by the first ring. The jointly surrounded flux area A of all the turns and the flux concatenation which is associated with it are thus increasingly reduced in magnitude. In order to compensate for this, the overall extent of the spiral coil must be correspondingly enlarged, so that additional chip area is required.

Furthermore, the magnetic flux element which flows through the electrical conductors causes eddy currents in the conductor material, which in turn results in additional losses.

However, the main problem of planar spiral coils is in the direction of the magnetic flux since, due to the alignment of the spiral coils, the majority of this magnetic flux is necessarily carried through the substrate. Parasitic eddy current effects likewise occur there, depending on the substrate conductance, and their resistive losses decrease the coil Q-factor. The described effects mean that integrated spiral coils on conductive substrates (p<20 $\Omega$cm) have only relatively low Q-factors (Q<15). Despite major efforts by the component manufacturers, it has until now not been possible to develop integrated spiral coils with a Q-factor of more than 15 for large-scale production.

The use of ferromagnetic materials with high permeabilities has therefore been proposed in order to increase the Q-factor of inductors. Thus, for example, the document M. Yamaguchi et al., "Characteristics and Analysis of Thin Film Inductor with Closed Magnetic Circuit Structure" IEEE Transactions On Magnetics, Vol. 28, No. 5, Tohoku University in Japan, Sep. 1992, pages 3015–17 discloses experiments with Permalloy for embedding planar coil conductors. The planar coils were integrated on a glass substrate between two Permalloy layers. Similar coil concepts are also disclosed in the document T. Inoue et al., "The Effect of Magnetic Film Structure on the Inductance of a Planar Inductor," IEEE Transactions On Magnetics, Vol. 34, No. 4, Japan, Jul. 1998, pages 1372–74 and JP 06-084639.

Since the magnetic field H is at right angles to the magnetic layer in all these coil concepts, the way in which the magnetic flux is carried is, however, highly ineffective. Furthermore, a closed magnetic flux can be achieved, by virtue of the technology, only with great difficulty, and air gaps between the layers decrease the effective permeability of the flux circuit.

In order to make it possible to use the characteristics of ferromagnetic materials more effectively, the use of helical coils (solenoids) or annular coils (toroids) with ferromagnetic cores has also been proposed. Integrated inductors such as these have been disclosed, for example, in the documents EP 0 725 407, U.S. Pat. Nos. 5,279,988, 5,998,048 and 6,008,102 and the diploma thesis by Ulrich van Knobloch, "Herstellung und Charakterisierung von integrierten Hochfrequenzspulen mit magnetischem Kern" [Production and characterization of integrated radio-frequency coils with a magnetic core], Institute for Semiconductor Technology and Materials for Electrical Engineering at the University of Hanover.

In this case, unfortunately, it has been found that although the proposed helical coils with ferromagnetic cores make it possible to increase the Q-factors of the coils, the increase in the Q-factor is, however, generally not sufficient to justify the likewise increased production cost for manufacturing the ferromagnetic cores. The present invention is therefore based on the object of providing a magnetic component whose parameters are considerably better than those of the previous magnetic components, in particular with a considerably better Q-factor.

SUMMARY OF THE INVENTION

This object can be achieved by a magnetic component which is integrated on a substrate, comprising at least one first electrical conductor which has at least one turn, at least one first magnetic conductor composed of at least one first layer of magnetic material, with the domains of the magnetic material being aligned along a first direction, and the turn of the first electrical conductor surrounding the first magnetic conductor, and at least one second magnetic conductor composed of at least one second layer, which is different to the first layer, of magnetic material, with the domains of the magnetic material being aligned along a second direction, and the first and the second magnetic conductors being arranged one behind the other in a magnetic circuit, such that a magnetic field which is produced by a current in the first electrical conductor is carried in the magnetic conductors, and the magnetic field in the first magnetic conductor is aligned essentially at right angles to the first direction, and in the second magnetic conductor is aligned essentially at right angles to the second direction.

At least one of the magnetic conductors can be slotted. At least one of the magnetic conductors can be a layer sequence composed of magnetic layers and electrically insulating layers. The magnetic material can be a soft-magnetic material. The first and the second magnetic conductors can be arranged in different planes. The first and the second magnetic conductors may form a closed magnetic circuit. The electrical conductor can be formed from copper. The electrical conductor can be in the form of two metalization planes, which are connected by means of vias. Contact holes, through which the vias are passed, can be provided in the first layer of magnetic material. A second electrical conductor having at least one turn can be provided, with the turn of the second electrical conductor surrounding the second magnetic conductor. The magnetic component can be in the form of a transformer. The magnetic component can be in the form of an inductance with two coils of opposite polarity.

According to the invention, a magnetic component is provided which is integrated on a substrate and has the following features:

at least one first electrical conductor which has at least one turn, at least one first magnetic conductor composed of at least one first layer of magnetic material, with the domains of the magnetic material being aligned along a first direction, and the turn of the first electrical conductor surrounding the first magnetic conductor, and at least one second magnetic conductor composed of at least one second layer, which is different to the first layer, of magnetic material, with the domains of the magnetic material being aligned along a second direction, and the first and the second magnetic conductors being arranged one behind the other in a magnetic circuit, such that a magnetic field which is produced by a current in the first electrical conductor is carried in the magnetic conductors, and the magnetic field in the first magnetic conductor is aligned essentially at right angles to the first direction, and in the second magnetic conductor is aligned essentially at right angles to the second direction.

The magnetic component according to the invention uses at least two different layers or layer sequences composed of magnetic material for carrying and amplifying the magnetic flux, that is to say the first and the second layer are produced using different layer production processes or process steps. The use of two different layers which may, however, have the same material composition allows a magnetic circuit with a locally matched domain alignment to be formed by the magnetic conductors. The magnetic component according to the invention accordingly makes it possible to achieve considerable improvements in the component parameters, in particular a considerable increase in the Q-factor. In this case, the magnetic circuit formed by the magnetic conductors does not necessarily need to be closed. Furthermore, the first direction, in which the domains in the first layer are aligned, and the second direction, in which the domains in the second layer are aligned, do not necessarily need to be different.

The magnetic region structure of layers composed, for example, of ferromagnetic materials is characterized by the existence of domains ("Weiss zones"): The layer material is locally always magnetized into saturation on the basis of the ferromagnetic coupling of the elementary dipoles. Three-dimensional areas within the layer material which are saturated are referred to as domains. Global magnetization states in the layer are produced by different domain arrangements. The domain walls form a boundary between the domains. The magnetization direction is rotated continuously in the domain walls, from the preferred direction for one domain to the preferred direction from the adjacent domain.

When a magnetic field is applied to a domain structure, different processes may take place. These depend essentially on the direction in which the external field acts on the existing domains. If a magnetic field is applied parallel to the alignment of the domains (so-called "soft direction"), this leads to domain wall shifts: domains which are magnetized in the direction of the magnetic field grow at the expense of domains whose magnetization is in the opposite direction to the magnetic field. This remagnetization process results in a permeability $\mu_r$ of approximately $10^5$ to $10^6$. However, it is restricted only to alternating fields up to a frequency of 10 MHz. With high-frequency alternating fields, the relatively high inertia of the domain walls means that the magnetic material can no longer follow the external field. The permeability of the material is decreased to a value $\mu_r$ of about 1.

A different form of remagnetization takes place in the situation where the magnetic field is applied at right angles to the alignment of the domains (so-called "hard direction"). This leads to the magnetization being rotated within the domains. The magnetization is reversibly rotated from the original preferred direction, in order to follow the applied magnetic field. Depending on the material that is used, this remagnetization process gives a permeability $\mu_r$ of about 10 to 1000 (for example Co—Zr—N—B: $\mu_r$=200 at f<1 GHz, Co—Fe: $\mu_r$=30 at f<8 GHz) even at high frequencies in a range between 500 MHz and 10 GHz. For applications using a frequency of more than 10 MHz, it is thus preferable for the magnetic field to be applied essentially at right angles to the alignment of the domains.

The previously proposed integrated coils, which were based essentially on only a single magnetic layer, resulted in the repeated occurrence of sections of the magnetic circuits in which the magnetic field was oriented parallel to the domains. These sections of the magnetic circuit thus contributed nothing to amplification of the magnetic field at high frequencies, even though these sections were composed of magnetic material. The magnetic component according to the present invention avoids such sections by using at least two magnetic conductors composed of two different layers. The alignment of the domains in the layers and/or the three-dimensional arrangement of the layers with respect to one another can accordingly be chosen such that sections in which the magnetic field is oriented parallel to the domains can largely be avoided. This leads to considerably more effective utilization of the magnetic material, which in turn results in the magnetic component having considerably better parameters.

Furthermore, the magnetic flux is kept away from the substrate and away from the winding, so that the eddy current losses at these points are minimized. The magnetic component according to the invention can accordingly also be formed on conductive substrates. Since the inductance, for example, of a coil is essentially directly proportional to the permeability $\mu_r$ of the core material, the Q-factor of the coil also depends directly on the permeability $\mu_r$ of the core material. A high permeability $\mu_r$ allows considerably smaller coils to be produced. The reduction in the size of the electrical conductor length that results from this leads to an improvement in the Q-factor, due to the reduced resistive losses.

According to one preferred embodiment of the magnetic component according to the invention, at least one of the magnetic conductors is slotted. Furthermore, it is preferable for at least one of the magnetic conductors to be a laminate composed of magnetic layers and electrically insulating layers. Slotting and/or lamination of the magnetic material makes it possible to largely avoid eddy current losses in the magnetic material.

According to a further preferred embodiment of the magnetic component according to the invention, the magnetic material is a soft-magnetic material.

According to a further preferred embodiment of the magnetic component according to the invention, the first and the second magnetic conductors are arranged in different planes. In this case, the magnetic flux is not restricted to the plane of the first layer of magnetic material, and this results in a considerable increase in the design freedom for the magnetic component. Furthermore, in this case, the second direction, in which the domains of the second layer are aligned, can match the first direction, in which the domains in the first layer are aligned. It is also preferable for the first and the second magnetic conductors to form a closed magnetic circuit.

According to a further preferred embodiment of the magnetic component according to the invention, the electrical conductor is formed from copper. It is furthermore preferable for the electrical conductor to be in the form of two metalization planes, which are connected by means of vias. In this case, it is particularly preferable for contact holes, through which the vias are passed, to be provided in the first layer of magnetic material. Appropriately large edge areas of the magnetic conductor make it possible to prevent edge domains from penetrating into the magnetically active areas of the magnetic conductor.

According to a further preferred embodiment of the magnetic component according to the invention, a second electrical conductor having at least one turn is provided, with the second magnetic conductor being arranged within the turn of the second electrical conductor. Appropriate interconnection of the first and of the second electrical conductors thus makes it possible to produce either a transformer or a coil with increased inductance. If a magnetic component such as this is used as a coil, then it is preferable for the first electrical conductor and the first magnetic conductor together to form a first helical coil, and for the second electrical conductor and the second magnetic conductor together to form a second helical coil, with the two helical coils being connected in series and having opposite polarity.

BRIEF DESCRIPTION OF THE DRAWING

The invention will be described in more detail in the following text with reference to the figures in the drawing, in which:

FIG. 1 shows a first embodiment of the magnetic component according to the invention, FIG. 3 shows a further embodiment of the magnetic component according to the invention, FIG. 5 shows a further embodiment of the magnetic component according to the invention, and FIG. 6 shows a further embodiment of the magnetic component according to the invention.

DESCRIPTION OF THE INVENTION

Figure 2:
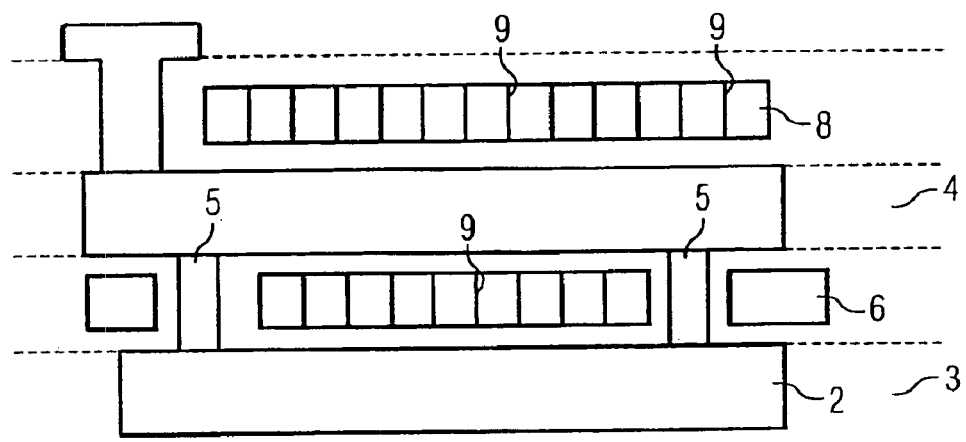
FIG. 2 shows a further cross-sectional view of the first embodiment of the magnetic component according to the invention.

FIG. 1 shows a first embodiment of the magnetic component according to the invention. In this case, in this embodiment, the magnetic component according to the invention forms an integrated coil. The magnetic component according to the invention has a first electrical conductor 2, which has a large number of turns. In order to reduce the electrical resistance, the electrical conductor 2 is formed from copper and extends over two metalization planes 3 and 4, which are connected by means of vias 5.

A first layer sequence 6 composed of magnetic layers 6a and electrically insulating layers 6b is arranged between the metalization planes 3 and 4. This layer sequence forms a first magnetic conductor 7, with the turns of the electrical conductor 2 surrounding the first magnetic conductor 7. In this case, the magnetic layers 6a are preferably composed of a soft-magnetic material, such as Permalloy, whose domains are aligned along a first direction at right angles to the plane of the drawing. The electrically insulating layers 6b are produced, for example, from silicon oxide.

As can be seen in FIG. 2, in addition to the laminate structure (not shown in FIG. 2), the magnetic conductor 7 has a large number of slots 9, which are in turn filled with silicon oxide. The slotting and the lamination of the magnetic material make it possible to largely avoid eddy current losses in the magnetic material. Furthermore, contact holes through which the vias 5 are passed are provided in the first layer sequence 6. The correspondingly large edge regions of the magnetic material make it possible to prevent edge domains from penetrating in the magnetically active regions of the magnetic conductor 7.

A second layer sequence 8 composed of magnetic layers 8a and electrically insulating layers 8b is arranged above the upper metalization plane 4. This second layer sequence 8 forms a second magnetic conductor 10. In this case, the magnetic layers 8a are likewise composed of a soft-magnetic material, such as Permalloy, whose domains are once again aligned along the direction at right angles to the plane of the drawing. The electrically insulating layers 8b are likewise produced from silicon oxide. Furthermore, contacts for the electrical conductor 2 are provided on the side of the layer sequence (FIG. 2).

The first magnetic conductor 7 and the second magnetic conductor 10 form the major components of a magnetic circuit, which is closed via the insulating material between the outer regions of the magnetic conductors 7 and 10. The physical arrangement of the layer sequences 6 and 8 as well as the alignment of the domains in the layer sequences mean that a magnetic field which is produced by a current in the first electrical conductor 2 and is carried in the magnetic conductors 7 and 10 is aligned at right angles to the direction of the domains in each of the two magnetic conductors 7 and 10. This thus results in the magnetization being rotated within the domains. The magnetization is reversibly rotated from the original preferred direction, in order to follow the applied magnetic field. Depending on the material which is used, this remagnetization process results in a permeability $\mu_r$ of about 10 to 1000 even at high frequencies in a range between 500 MHz and 10 GHz.

FIG. 3 shows a further embodiment of the magnetic component according to the invention. The embodiment which is illustrated in FIG. 3 corresponds essentially to the embodiment illustrated in FIG. 1, with the difference that an appropriate configuration of the second magnetic conductor 10 results in a closed magnetic circuit, which is formed only from the magnetic conductors 7 and 10.

Figure 4:
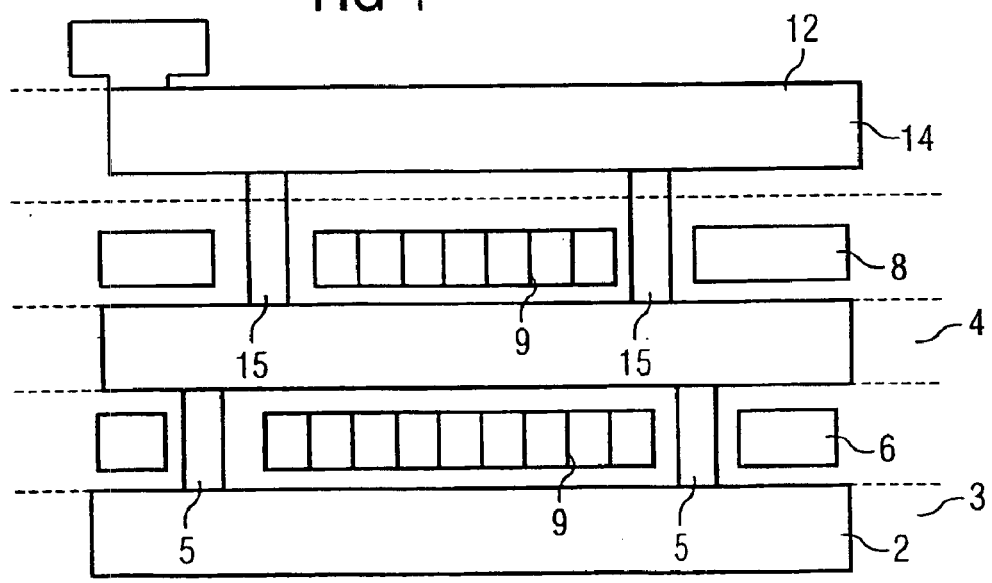
FIG. 4 shows a further embodiment of the magnetic component according to the invention.

FIG. 4 shows at further embodiment of the magnetic component according to the invention. In contrast to the previously described embodiments, the embodiment which is illustrated in FIG. 4 has a second electrical conductor 12, whose turns surround the second magnetic conductor 10, and which extends over the metalization plane 4 and a further metalization plane 14. The metalization planes 4 and 14 are in turn electrically conductively connected to one another by means of vias 15.

Appropriate interconnection of the first and of the second electrical conductors 12 thus makes it possible to produce either a transformer or a coil with increased inductance. If a magnetic component such as this is used as a coil, then it is preferable for the first electrical conductor 2 and the first magnetic conductor 7 together to form a first helical coil, and for the second electrical conductor 12 and the second magnetic conductor 10 together to form a second helical coil, with the two helical coils being connected in series and having opposite polarity.

FIG. 5 shows a further embodiment of the magnetic component according to the invention. Like the embodiment which is illustrated in FIG. 4, the embodiment which is illustrated in FIG. 5 has a second electrical conductor 12, whose turns surround the second magnetic conductor 10. In contrast to the embodiment which is illustrated in FIG. 4, an additional metalization plane 16 is provided in the embodiment which is illustrated in FIG. 5, so that the second electrical conductor 12 extends over the metalization plane 14 and over the additional metalization plane 16. The metalization planes 14 and 16 are once again electrically conductively connected to one another by means of vias 17.

FIG. 6 shows a further embodiment of the magnetic component according to the invention. In contrast to the embodiments described so far, the magnetic component in the embodiment which is illustrated in FIG. 6 is arranged in only one plane, and FIG. 6 shows a top view of this plane. The magnetic component according to the invention surrounds a first electrical conductor 2, which has a large number of turns. In order to reduce the electrical resistance, the electrical conductor 2 is formed from copper and extends over two metalization planes (which are not shown), which are connected by means of vias 5.

The turns of the electrical conductor 2 surround the first magnetic conductor 7, which is formed from a first layer sequence 6 composed of magnetic layers and electrically insulating, layers. The magnetic component which is illustrated in FIG. 6 also has a further magnetic conductor 18, which is likewise formed from the first layer sequence 6. In addition, the magnetic component which is illustrated in FIG. 6 has the magnetic conductors 10a and 10b, which are formed from a second layer sequence 8 composed of magnetic layers and electrically insulating layers.

Once again, in addition to the laminate structure, the magnetic conductors 7, 10a, 10b and 18 have a large number of slots (which are not shown), which are once again filled with an insulating material. The slotting and the lamination of the magnetic material make it possible to largely avoid eddy current losses in the magnetic material.

In order to assist understanding of the invention, FIG. 6 also shows the domain structure of the magnetic material. In this case, the domains are illustrated in an exaggerated large form, for clarity reasons. As can be seen, the domains of the magnetic conductors 7 and 18, which are formed from the first layer 6 of magnetic material, are aligned in a first direction (x direction). In contrast to this, the domains of the magnetic conductors 10a and 10b, which are formed from the second layer 8 of magnetic material, are aligned in a second direction (y direction), at right angles to the first direction (x direction).

The magnetic conductors which are illustrated in FIG. 6, with their domain directions, may be produced, for example, by the following process steps. A resist mask, which has openings at the points at which, for example, the magnetic conductors 7 and 18 are intended to be produced, is produced on a substrate in which the lower metalization plane has already been produced. The first layer sequence 6 of magnetic material is then applied, for example by sputtering, over the entire surface. A so-called lift-off technique is then used to once again remove this layer sequence, except for those layer parts which are arranged in the openings in the resist mask. Heat treatment is then carried out in a relatively strong magnetic field in order to impress the domain alignment of the magnetic conductors 7 and 18 as shown in FIG. 6.

A resist mask is now once again applied to the structure produced in this way, having openings at the points at which the magnetic conductors 10a and 10b are intended to be produced. The second layer 8 of magnetic material is then applied by sputtering. However, at this stage, a magnetic field has already been applied during the sputtering process in order to impress the desired domain alignment, thus resulting in the domain alignment of the magnetic conductors 10a and 10b as shown in FIG. 6. The structure which is illustrated in FIG. 6 is finally produced by means of a further lift-off process, In addition to the domain alignments, FIG. 6 illustrates the magnetic field H which is produced by a current in the first electrical conductor 2. As can be seen, the magnetic field is carried in the magnetic conductors 7, 10a, 10b and 17, and the magnetic field H in the magnetic conductors is in each case aligned essentially at right angles to the domain alignments.

In contrast to the previously proposed integrated coils according to the prior art, which are essentially based on only a single magnetic layer and accordingly repeatedly have sections in which the magnetic field was oriented parallel to the domains, the magnetic component according to the present invention avoids such sections by using at least two magnetic conductors composed of two different layers. The alignment of the domains in the layers and/or the physical arrangement of the layers with respect to one another can accordingly be chosen such that it is largely possible to avoid sections in which the magnetic field is oriented parallel to the domains. This leads to considerably more effective utilization of the magnetic material, which in turn results in the magnetic component having considerably better parameters. In particular, this makes it possible to produce integrated coils which have a Q-factor of $Q \geqq 30$ or $Q \geqq 50$.

What is claimed is:

1. A magnetic component which is integrated on a substrate, comprising
   at least one first electrical conductor which has at least one turn,
   at least one first magnetic conductor composed of at least one first layer of magnetic material, with the domains of the magnetic material being aligned along a first direction, and the turn of the first electrical conductor surrounding the first magnetic conductor, and
   at least one second magnetic conductor composed of at least one second layer, which is different to the first layer, of magnetic material, with the domains of the magnetic material being aligned along a second direction, and the first and the second magnetic conductors being arranged one behind the other in a magnetic circuit, such that
   a magnetic field which is produced by a current in the first electrical conductor is carried in the magnetic conductors, and the magnetic field in the first magnetic conductor is aligned essentially at right angles to the first direction, and in the second magnetic conductor is aligned essentially at right angles to the second direction.

2. The component as claimed in claim 1, wherein at least one of the magnetic conductors is slotted.

3. The component as claimed in claim 1, wherein at least one of the magnetic conductors is a layer sequence composed of magnetic layers and electrically insulating layers.

4. The component as claimed in claim 1, wherein the magnetic material is a soft-magnetic material.

5. The component as claimed in claim 1, wherein the first and the second magnetic conductors are arranged in different planes.

6. The component as claimed in claim 1, wherein the first and the second magnetic conductors form a closed magnetic circuit.

7. The component as claimed in claim 1, wherein the electrical conductor is formed from copper.

8. The component as claimed in claim 1, wherein the electrical conductor is in the form of two metalization planes, which are connected by means of vias.

9. The component as claimed in claim 8, wherein contact holes, through which the vias are passed, are provided in the first layer of magnetic material.

10. The component as claimed in claim 1, wherein a second electrical conductor having at least one turn is provided, with the turn of the second electrical conductor surrounding the second magnetic conductor.

11. The component as claimed in claim 10, wherein the magnetic component is in the form of a transformer.

12. The component as claimed in claim 10, wherein the magnetic component is in the form of an inductance with two coils of opposite polarity.

* * * * *